(12) United States Patent  (10) Patent No.: US 6,674,281 B2
Shieh  (45) Date of Patent: Jan. 6, 2004

(54) METHOD FOR MEASURING MAGNETIC FIELD BASED ON ELECTRO-OPTIC PROBING TECHNIQUE AND MEASURING ELECTRIC FIELD BASED ON MAGNETIC PROBING TECHNIQUE

(75) Inventor: Kuen-Wey Shieh, Kaohsiung (TW)

(73) Assignee: Precision Instrument Development Center National Science Council (TW)

( * ) Notice: Subject to any disclaimer, the term of this patent is extended or adjusted under 35 U.S.C. 154(b) by 0 days.

(21) Appl. No.: 10/100,382

(22) Filed: Mar. 18, 2002

(65) Prior Publication Data

US 2003/0173960 A1 Sep. 18, 2003

(51) Int. Cl.$^7$ .................. G01R 33/032; G01R 31/308
(52) U.S. Cl. ............... 324/244.1; 324/260; 324/753; 702/152
(58) Field of Search .................. 324/244, 244.1, 324/750, 753, 758, 96, 260; 359/245, 280; 702/152, 153

(56) References Cited

U.S. PATENT DOCUMENTS

| 4,147,979 | A | * | 4/1979 | Baues et al. ............. 324/244.1 |
| 4,438,401 | A | * | 3/1984 | Iwamoto et al. ............ 324/326 |
| 4,894,608 | A | * | 1/1990 | Ulmer, Jr. ..................... 324/96 |
| 5,243,403 | A | * | 9/1993 | Koo et al. .................. 356/477 |
| 5,267,336 | A | * | 11/1993 | Sriram et al. .................. 385/2 |
| 5,331,275 | A | * | 7/1994 | Ozaki et al. ................. 324/757 |
| 5,736,856 | A | * | 4/1998 | Oliver et al. ............. 324/244.1 |
| 6,215,121 | B1 | * | 4/2001 | Fujihira et al. ............. 250/306 |
| 6,316,937 | B1 | * | 11/2001 | Edens ........................ 324/220 |
| 6,396,054 | B1 | * | 5/2002 | Kley ............................ 250/234 |
| 6,414,473 | B1 | * | 7/2002 | Zhang et al. .................. 324/96 |
| 6,437,885 | B1 | * | 8/2002 | Duncan ....................... 359/280 |
| 6,483,304 | B1 | * | 11/2002 | Kou et al. ................. 324/258 |
| 2002/0008533 | A1 | * | 1/2002 | Ito et al. ..................... 324/758 |

FOREIGN PATENT DOCUMENTS

JP  2001272332 A * 10/2001 .......... G01N/21/17

OTHER PUBLICATIONS

Freeman et al. "High speed magnetic imaging," Summaries of Papers Presented at the Quantum Electronics Conference, 1998, IQEC 98 Technical Digest, p. 76.*
Yamazaki et al. "Three-dimensional magneto-optic near-field mapping over 10–50 mm-scale line and space circuit patterns," Laser and Electro-Optics Society, 2001, vol. 1 pp. 318–319.*

* cited by examiner

Primary Examiner—Jay Patidar
Assistant Examiner—Darrell Kinder
(74) Attorney, Agent, or Firm—Volpe and Koenig, P.C.

(57) ABSTRACT

The present invention provides a method for measuring both magnetic and electric fields of a DUT via an electro-optic probing technique at the same time. Also, the present invention provides a method for measuring both electric and magnetic fields via a magneto-optic probing technique simultaneously. The method utilizes the modulation of the position of a probe to measure the electric and magnetic field signals. The DC and AC components of the modulated electric (or magnetic) field signals can be obtained by means of a low pass filter and a lock-in amplifier, respectively. Through a simple calculation, the electric and magnetic field can be obtained simultaneously.

10 Claims, 3 Drawing Sheets

METHOD FOR MEASURING MAGNETIC FIELD BASED ON ELECTRO-OPTIC PROBING TECHNIQUE AND MEASURING ELECTRIC FIELD BASED ON MAGNETIC PROBING TECHNIQUE

FIELD OF THE INVENTION

The present invention relates to a method for measuring a magnetic field via an electro-optic probing technique and measuring an electric field via a magneto-optic probing technique.

BACKGROUND OF THE INVENTION

Traditionally, an electro-optic (EO) probing technique can only measure an electric field (E field) of a device under test (DUT). Similarly a magneto-optic (MO) probing technique can only measure a magnetic field (H field) of the DUT. This invention will make a breakthrough that the EO probing technique can measure not only the E field but also the H field at the same time. The invention also can be applied to the MO probing technique. In other words, the MO probing technique can measure both H and E fields at the same time.

SUMMARY OF THE INVENTION

It is therefore an object of the present invention to propose a MO probing technique which can measure both magnetic and electric fields at the same time.

It is therefore another object of the present invention to propose an EO probing technique which can measure not only the electric field but also the magnetic field at the same time.

According to an aspect of the present invention, a method for measuring a three-dimensional magnetic-field of a DUT includes the steps of providing an electric field probing system which has a probe for detecting a three-dimensional electric-field of the DUT; placing the probe above the DUT; modulating spatially the position of the probe and detecting the electric field of the DUT to generate modulated three-dimensional electric field signals; separating DC components from AC components in the modulated three-dimensional electric field signals; and calculating a three-dimensional magnetic field of the DUT by using the DC and the AC components of the modulated three-dimensional electric field signals.

Preferably, the electric field probing system is an electro-optic probing system.

Preferably, the electric field probing system further includes a low pass filter for filtering the DC components out of the modulated three-dimensional electric field signals.

Preferably, the electric field probing system further includes a lock-in amplifier for detecting amplitudes of the AC components of the modulated three-dimensional electric field signals.

According to another aspect of the present invention, a method for measuring a three-dimensional magnetic field of a DUT includes the steps of providing an electric field probing system which has a probe for detecting a three-dimensional electric-field of the DUT; placing the probe above the DUT and fixing the probe at a position; modulating spatially the position of the DUT and detecting the electric field of the DUT to generate modulated three-dimensional electric field signals; separating the DC components from the AC components in the modulated three-dimensional electric field signals; and calculating a three-dimensional magnetic-field of the DUT by using the DC and the AC components of the modulated three-dimensional electric field signals.

According to another aspect of the present invention, a method for measuring a three-dimensional electric-field of a DUT includes the steps of providing a magnetic field probing system which has a probe for detecting a three-dimensional magnetic-field of the DUT; placing the probe above the DUT at a position, modulating spatially the position of the probe and detecting the magnetic field of the DUT to generate modulated three-dimensional magnetic field signals; separating the DC components from the AC components in the modulated three-dimensional magnetic field signals; and calculating a three-dimensional electric-field of the DUT by using the DC and the AC components of the modulated three-dimensional magnetic field signals.

Preferably, the magnetic field probing system is a magneto-optic probing system.

Preferably, the magnetic field probing system further includes a low pass filter for filtering the DC components out of the modulated three-dimensional magnetic field signal.

Preferably, the magnetic field probing system further includes a lock-in amplifier for detecting amplitudes of the AC components of the modulated three-dimensional magnetic field signals.

According to another aspect of the present invention, a method for measuring a three-dimensional electric-field of a DUT includes the steps of providing an magnetic field probing system which has a probe for detecting a three-dimensional magnetic-field of the DUT; placing the probe above the DUT and fixing the probe at a position, modulating the position of the DUT and detecting the magnetic field of the DUT to generate modulated three-dimensional magnetic field signals; separating the DC components from the AC components in the modulated three-dimensional magnetic field signals; and calculating a three-dimensional electric-field of the DUT by using the DC components and the AC components of the modulated three-dimensional magnetic field signals.

The present invention may best be understood through the following description with reference to the accompanying drawings, in which:

DETAILED DESCRIPTION OF THE PREFERRED EMBODIMENT

The electro-optic (EO) probing technique is a very useful approach to measure an electric-field (E-field). The operating principles of the EO probing technique are based on the electro-optic effect of a crystal. When an external electric field is applied to the crystal, there is some variation in the refractive index of the crystal. A laser beam is used to sense the variation of the refractive index of the crystal, which can be detected by signal processing techniques. Thus the magnitude and phase of the external electric field can be derived from the measurement of the variation of the refractive index of the crystal. Similarly, the operating principles of the MO probing technique are based on the magneto-optic effect of a crystal. When an external magnetic field is applied to the crystal, there is some variation in the refractive index of the crystal. Thus the intensity and phase of the external magnetic field can be derived from the measurement of the variation of the refractive index of the crystal. The present invention provides a method for measuring both magnetic and electric fields of a DUT by means of an electro-optic probing technique at the same time. Also, the present invention provides a method for measuring both electric and magnetic fields by means of a magneto-optic probing technique simultaneously. The method utilizes the modulation of the position of the probe to obtain both electric and magnetic field signals of the DUT. The DC and AC components of the electric, or magnetic field, signals can be separate via a low pass filter and a lock-in amplifier, respectively. Through a simple calculation, the electric and magnetic field can be obtained simultaneously.

Figure 1:
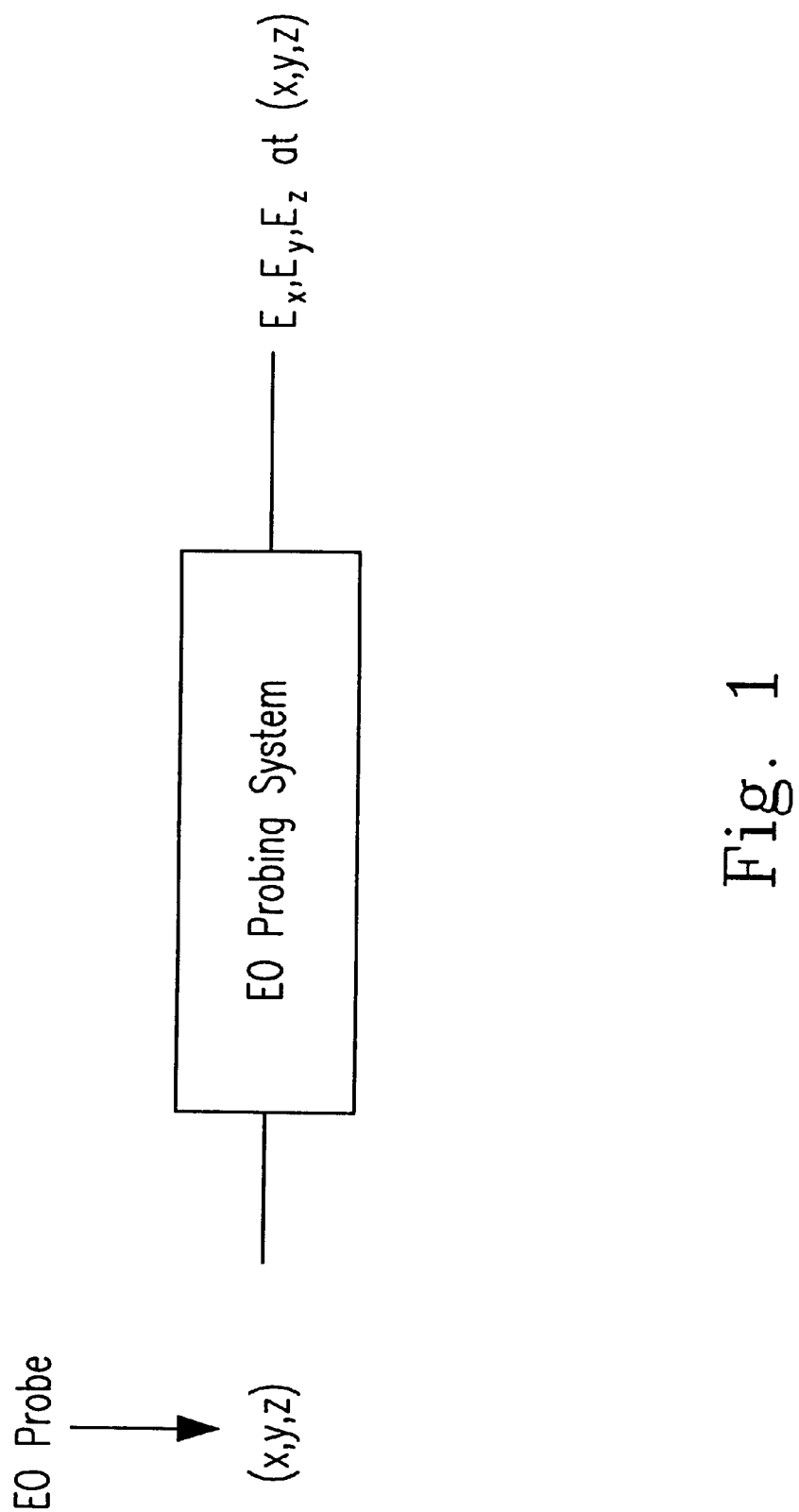
FIG. 1 is a block diagram of an EO probing system for measuring an electric field of a DUT at the position, (x,y,z), of the probe according to a preferred embodiment of the present invention.

FIG. 1 is a block diagram of an EO probing system for measuring an electric field of a DUT at a position, (x, y, z), according to a preferred embodiment of the present invention. As shown in FIG. 1, the EO probing system is provided to measure a three-dimensional electric field of a DUT. The EO probing system has a probe, which is disposed above the DUT at the position, (x, y, z). The output of the EO probing system is a three-dimensional electric-field signal $E=\hat{x}E_x+\hat{y}E_y+\hat{z}E_z$, expressed in a phasor form, of a DUT, where $E_x$, $E_y$ and $E_z$ are functions of x, y and z. The method for measuring a three-dimensional magnetic field of the DUT via the EO probing system is provided as follows:

1. Taking $E_x$ as an example, if the probe is modulated around (x, y, z) with respect to the x axis, the modulated output signals of the EO probing system is shown as below:

For $\Delta \approx 0$, $$E_x(x+\Delta\sin\omega_m t, y, z) \approx E_x(x, y, z) + \Delta\sin\omega_m t \frac{\partial E_x(x, y, z)}{\partial x} \quad (1)$$

For the same reason:

$$E_y(x+\Delta\sin\omega_m t, y, z) \approx E_y(x, y, z) + \Delta\sin\omega_m t \frac{\partial E_y(x, y, z)}{\partial x} \quad (2)$$

$$E_z(x+\Delta\sin\omega_m t, y, z) \approx E_z(x, y, z) + \Delta\sin\omega_m t \frac{\partial E_z(x, y, z)}{\partial x} \quad (3)$$

where, $E_x(x,y,z)$, $E_y(x,y,z)$ and $E_z(x,y,z)$ are the DC components of the modulated electric field signals in equations (1), (2) and (3), respectively;

$$\frac{\partial E_x(x, y, z)}{\partial x}, \frac{\partial E_y(x, y, z)}{\partial x} \text{ and } \frac{\partial E_z(x, y, z)}{\partial x}$$

are implied in the AC components of the modulated electric field signals in equations (1), (2) and (3), respectively.

Figure 2:
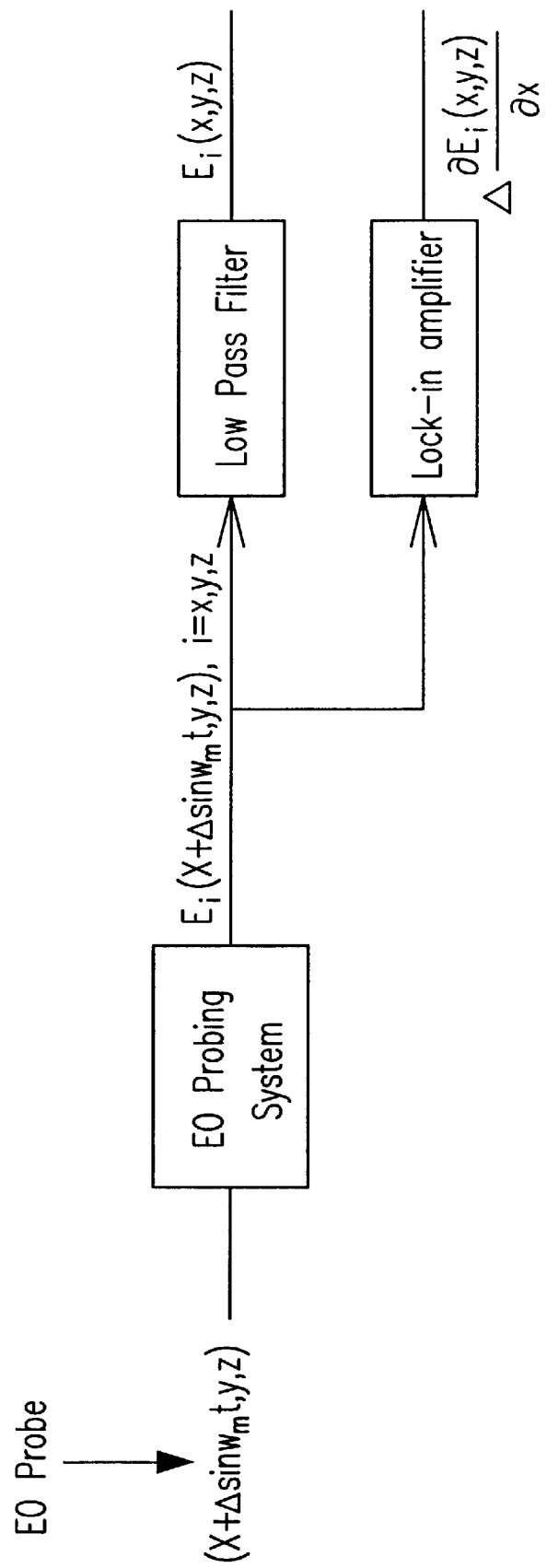
FIG. 2 is a block diagram of an EO probing system with the EO probe modulation technique for measuring a DC component and an AC component of the electric field of the DUT with respect to the x-axis direction according to a preferred embodiment of the present invention.

FIG. 2 is a block diagram of an EO probing system with the EO probe modulation technique for measuring a DC component and an AC component of the modulated electric field of the DUT with respect to the x-axis direction according to a preferred embodiment of the present invention. As shown in FIG. 2, taking formula (2) as an example, the DC component of y-component electric field $E_y$ can be detected through a low pass filter (LPF). Also, the amplitude, $$\Delta \frac{\partial E_y(x, y, z)}{\partial x},$$

of the AC components can be detected through a lock-in amplifier.

For the same reason, if the position of the probe is modulated around (x, y, z) with respect to y and z-axis, the DC component, $E_i(x,y,z)$, of electric field, and the AC components, $$\Delta \frac{\partial E_i(x, y, z)}{\partial j},$$

i,j=x,y,z, can be obtained

2. Using the Maxwell's equation, $$\nabla \times E = -j\omega\mu H \quad (4)$$

From the formula (4), $$H_x = \frac{1}{-j\omega\mu}\left(\frac{\partial E_z}{\partial y} - \frac{\partial E_y}{\partial z}\right) \quad (5)$$

$$H_y = \frac{1}{-j\omega\mu}\left(\frac{\partial E_x}{\partial z} - \frac{\partial E_z}{\partial x}\right) \quad (6)$$

$$H_z = \frac{1}{-j\omega\mu}\left(\frac{\partial E_y}{\partial x} - \frac{\partial E_x}{\partial y}\right) \quad (7)$$

where, $j=\sqrt{-1}$; $\omega=2\pi f$; f is the frequency of the measured electromagnetic field; and $\mu$ is the permeability of the material.

Substituting the AC components, $$\frac{\partial E_i(x, y, z)}{\partial j},$$

i,j=x,y,z, of the modulated electric field signals into formulas (5), (6) and (7), the three-dimension magnetic field of the DUT can be obtained.

However, in FIG. 2, the output signals of the lock-in amplifier are $$\Delta \frac{\partial E_i(x, y, z)}{\partial j},$$

i,j=x,y,z, which are not the quantities, $$\frac{\partial E_i(x, y, z)}{\partial j},$$

i,j=x,y,z, required in formulas (5) to (7). According to a calibration using a standard DUT, the quantities, $$\frac{\partial E_i(x, y, z)}{\partial j},$$

can be obtained. The process is shown as below:

First, place the probe above the DUT. Secondly, modulate the position of the probe and detect the magnitude of $$\Delta \frac{\partial E_i(x, y, z)}{\partial j},$$

i,j=x,y,z. Subtract these signals, $$\Delta \frac{\partial E_i(x, y, z)}{\partial j},$$

i,j=x,y,z, from each other in algebra and substitute the result into formulas (5), (6) and (7). Therefore, the formulas are shown as follows:

$$\Delta \left( \frac{\partial E_z(x, y, z)}{\partial y} - \frac{\partial E_y(x, y, z)}{\partial z} \right) = -j\omega\mu\Delta H_x \quad (8)$$

$$\Delta \left( \frac{\partial E_x(x, y, z)}{\partial z} - \frac{\partial E_z(x, y, z)}{\partial x} \right) = -j\omega\mu\Delta H_y \quad (9)$$

$$\Delta \left( \frac{\partial E_y(x, y, z)}{\partial x} - \frac{\partial E_x(x, y, z)}{\partial y} \right) = -j\omega\mu\Delta H_z \quad (10)$$

The $\Delta$ can be solved because the left side of the equations (8), (9) and (10) are known, since they are the subtraction of the measured output signals of the lock-in amplifier. Also the magnetic fields on the right hand side of the equations, $H_x$, $H_y$ and $H_z$, are known, since they are the H fields of the standard DUT. Hence $$\Delta \frac{\partial E_i(x, y, z)}{\partial j}$$

can be accurately calibrated to $$\frac{\partial E_i(x, y, z)}{\partial j}.$$

Through the process of calibration, the probing system can measure the electric and magnetic field of any DUT at the same time.

Figure 3:
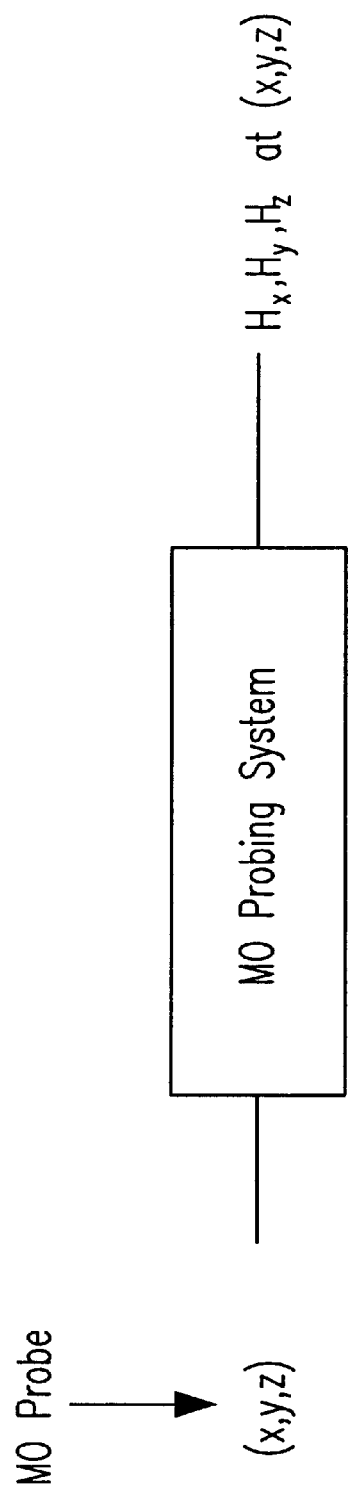
FIG. 3 is a block diagram of a MO probing system for measuring a magnetic field of a DUT at the position, (x,y,z), of the probe according to a preferred embodiment of the present invention.

FIG. 3 is a block diagram of a MO probing system for measuring a magnetic field of a DUT at (x, y, z) according to a preferred embodiment of the present invention. The MO probing system is provided to measure a three-dimensional magnetic field of a DUT. The MO probing system has a probe, which is disposed above the DUT at (x, y, z). The output signal of the MO probing system is a three-dimensional magnetic field, $H=\hat{x}H_x+\hat{y}H_y+\hat{z}H_z$, of a DUT.

As in the EO probing system, if the position of the probe of the MO probing system is modulated around the position, (x, y, z), with respect to the x, y and z axes, the DC components, $H_i(x,y,z)$, and the AC components, $$\frac{\partial H_i(x, y, z)}{\partial j},$$

i,j=x,y,z, of the modulated magnetic field signals can be obtained.

Substituting the DC components, $H_i(x,y,z)$, and the AC components, $$\frac{\partial H_i(x, y, z)}{\partial j},$$

i,j=x,y,z, of the modulated magnetic field signals into the Maxwell's equation, $\nabla \times H = j\omega\epsilon E$, yields $$E_x = \frac{1}{j\omega\epsilon} \left( \frac{\partial H_z}{\partial y} - \frac{\partial H_y}{\partial z} \right) \quad (11)$$

$$E_y = \frac{1}{j\omega\epsilon} \left( \frac{\partial H_x}{\partial z} - \frac{\partial H_z}{\partial x} \right) \quad (12)$$

$$E_z = \frac{1}{j\omega\epsilon} \left( \frac{\partial H_y}{\partial x} - \frac{\partial H_x}{\partial y} \right) \quad (13)$$

where $j=\sqrt{-1}$; $\omega=2\pi f$; f is the frequency of the measured electromagnetic field; $\epsilon$ is the permittivity of the material. Substitute the AC components, $$\frac{\partial H_i(x, y, z)}{\partial j},$$

i,j=x,y,z, of the modulated magnetic field signals into formulas (11), (12) and (13), and then the electric field of the DUT is obtained.

Actually, the method, spatially modulating the probe of a three-dimensional magnetic field measurement system, can be applied to any measurement system, not in particular an "EO" probing system. For the same reason, the method, spatially modulating the probe of a three-dimensional magnetic field measurement system, can be applied to any system, not restricted to an MO probing system. Equivalently, the spatial modulation of the position of the probe can be achieved by modulating the position of the DUT while the probe remains fixed.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A method for measuring a three-dimensional magnetic-field of a DUT, comprising the steps of:
   providing an electric field probing system, which has a probe for detecting a three-dimensional electric field of said DUT;
   placing said probe above said DUT at a position;
   modulating the position of said probe around said position and detecting said electric field of said DUT to generate modulated three-dimensional electric field signals;
   separating DC components from AC components in said modulated three-dimensional electric field signals; and
   calculating a three-dimensional magnetic field of said DUT by using said DC and said AC components of said modulated three-dimensional electric field signals.

2. The method according to claim 1, wherein said electric field probing system is an electro-optic probing system.

3. The method according to claim 1, wherein said electric field probing system further comprises a low pass filter for filtering said DC components out of said modulated three-dimensional electric field signals.

4. The method according to claim 1, wherein said electric field probing system further comprises a lock-in amplifier for detecting amplitudes of said AC components of said modulated three-dimensional electric field signals.

5. A method for measuring a three-dimensional magnetic-field of a DUT, comprising the steps of:

providing an electric field probing system, which has a probe for detecting a three-dimensional electric field of said DUT;

placing said probe above said DUT and fixing said probe at one position;

modulating the position of said DUT around said position and detecting said electric field of said DUT to generate modulated three-dimensional electric field signals;

separating DC components from AC components in said modulated three-dimensional electric field signals; and calculating a three-dimensional magnetic field of said DUT by using said DC components and said AC components of said modulated three-dimensional electric field signals.

6. A method for measuring a three-dimensional electric-field of a DUT, comprising the steps of:

providing a magnetic field probing system, which has a probe for detecting a three-dimensional magnetic field of said DUT;

placing said probe above said DUT at a position;

modulating spatially the position of said probe and detecting said magnetic field of said DUT to generate modulated three-dimensional magnetic field signals;

separating DC components from AC components in said modulated three-dimensional magnetic field signals; and calculating a three-dimensional electric field of said DUT by using said DC components and said AC components of said three-dimensional magnetic field signals.

7. The method according to claim 6, wherein said magnetic field probing system is a magneto-optic probing system.

8. The method according to claim 6, wherein said magnetic field probing system further comprises a low pass filter for filtering said DC components out of said modulated three-dimensional magnetic field signals.

9. The method according to claim 6, wherein said electric field probing system further comprises a lock-in amplifier for detecting amplitudes of said AC components of said modulated three-dimensional magnetic field signals.

10. A method for measuring a three-dimensional electric-field of a DUT, comprising the steps of:

providing a magnetic field probing system, which has a probe for detecting a three-dimensional magnetic field of said DUT;

placing said probe above said DUT and fixing said probe at a position;

modulating spatially the position of said DUT around said position and detecting said magnetic field of said DUT to generate modulated three-dimensional magnetic field signals;

separating DC components from AC components in said modulated three-dimensional magnetic field signals; and calculating a three-dimensional electric field of said DUT by using said DC components and said AC components of said modulated three-dimensional magnetic field signals.

* * * * *